United States Patent
Kapur et al.

(10) Patent No.: US 6,871,167 B1
(45) Date of Patent: Mar. 22, 2005

(54) SYSTEM AND METHOD FOR DETERMINING CAPACITANCE FOR LARGE-SCALE INTEGRATED CIRCUITS

(75) Inventors: Sharad Kapur, Jersey City, NJ (US); David E. Long, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/427,238

(22) Filed: Oct. 26, 1999

(51) Int. Cl.[7] .............................................. G06F 17/10
(52) U.S. Cl. ........................ 703/2; 703/13; 703/14; 702/27; 382/285
(58) Field of Search ............................. 703/2, 13, 14; 702/27; 382/285

(56) References Cited

U.S. PATENT DOCUMENTS

| | | | | |
|---|---|---|---|---|
| 6,051,027 A | * | 4/2000 | Kapur et al. ................. | 342/196 |
| 6,133,921 A | * | 10/2000 | Turkiyyah et al. ........... | 345/420 |
| 6,175,815 B1 | * | 1/2001 | Stalzer ........................... | 703/4 |
| 6,314,545 B1 | * | 11/2001 | Kapur et al. .................... | 703/1 |
| 6,345,235 B1 | * | 2/2002 | Edgecombe et al. ... | 342/357.12 |
| 6,351,572 B1 | * | 2/2002 | Dufour ........................ | 345/419 |
| 6,397,171 B1 | * | 5/2002 | Belk ............................. | 703/14 |

OTHER PUBLICATIONS

"Large–Scale Capacitance Calculation", by Sharad Kapur and David E. Long, 2000 ACM.*
"GMRES: A Generalized Minimal Residual Algorithm For Solving Nonsymmetric Linear Systems," by Y. Saad and M. H. Shultz, SIAM Journal on Scientific and Statistical Computing, 7(3):856–69, 1986.
Introduction to Numerical Analysis by J. Soer and R. Bulirsh, Springer–Verlag 1979 and in "Preconditioned, Adaptive, Multipole–Accelerated Iterative Methods For Three–Dimensional First–Kind Integral Equations of Potential Theory," by K. Nabors, et al., SIAM Journal on Scientific and Statistical Computing, 15(3):713–735, May 1994.

* cited by examiner

Primary Examiner—Kevin J. Teska
Assistant Examiner—Ed Garcia-Otero (57) ABSTRACT

For use in an integral equation formulation of capacitance, a system for, and method of, generating a representation of charge distribution for a given capacitive structure (which may be an integrated circuit). In one embodiment, the system includes: (1) a charge variation function generator that creates a multidimensional charge variation function that is not directly dependent on a conductive geometry of the structure and (2) a conductive geometry generator, associated with the charge variation generator, that creates a conductive geometry that is independent of charge variation in the structure, the charge variation function and the conductive geometry employable in the integral equation formulation to reduce a complexity thereof.

21 Claims, 4 Drawing Sheets

| CUBES | FDM TIME | GEOMETRY TIME | TOTAL TIME | MEMORY |
|---|---|---|---|---|
| 3,100 | 1.3 | 0.4 | 2.4 | 30 |
| 7,700 | 3.5 | 0.9 | 5.9 | 42 |
| 13,500 | 6.8 | 1.6 | 11.3 | 59 |
| 33,500 | 17.7 | 3.6 | 29 | 130 |
| 78,000 | 44 | 7.2 | 64 | 280 |
| 167,000 | 100 | 15 | 142 | 610 |

SYSTEM AND METHOD FOR DETERMINING CAPACITANCE FOR LARGE-SCALE INTEGRATED CIRCUITS

TECHNICAL FIELD OF THE INVENTION

The present invention is directed, in general, to integrated circuit (IC) design and, more specifically, to a system and method for determining capacitance for large-scale ICs.

BACKGROUND OF THE INVENTION

Interconnect analysis for modern ICs has traditionally required large scale capacitance calculations. However, such analysis required the geometry of the ICs to be described in detail, which resulted in millions, or even billions, of polygonal elements. The interconnect analysis yielded a sparse capacitance matrix of dominant coupling coefficients between conductors (commonly called "nets"). A net is formed of metallic pieces that are located within the IC and coupled together such that they cooperate to conduct current between two points. The net also has a capacitance associated with it.

Traditionally, capacitance calculations have not required great accuracy (accuracies of 10–20% were acceptable). To achieve this relatively low accuracy, pattern matching schemes consisting of precharacterized libraries were used. However, nets such as clock nets, power grids, sensitive analog nodes or critical paths of a circuit require a higher accuracy in their solution. Unfortunately, as the requirement for accuracy increased, pattern matching solutions became insufficient.

Numerical approaches were then explored in an effort to increase the accuracy in capacitive calculations. Conventional numerical approaches rendered conductor surfaces (nets) in terms of discrete elements. Enforcing the equation either as a set of collocation points or as a distribution, as with a Galerkin scheme, led to a dense linear system. The large size of these systems usually required that they be solved with Krylov iterative methods. The required matrix-vector products were accelerated with compressed-matrix schemes (such as FastCap), pre-corrected Fast Fourier Transforms, or Singular Value Decomposition ("SVD")-based representations. While these methods are capable of high accuracy, they are restricted to systems of only a few hundred thousand unknowns. Even with only one unknown per polygon, large problems having millions of polygons remained well beyond the reach of these methods.

The industry further tried what is conventionally termed a "random walk" method, based on the well-known Monte Carlo method. Unfortunately, the random walk method required a significant amount of central processing unit ("CPU") time to achieve high accuracy. For this reason, larger problems involving millions of polygons, proved to be unsatisfactory.

Next, finite-difference or finite-element methods were attempted. These methods required that a three-dimensional mesh be imposed on the geometry of the capacitive structure. However, these methods created more unknowns than did other numerical methods, and therefore were even less desirable.

Accordingly, what is needed in the art is way to increase the accuracy of IC capacitance calculations without incurring excessive computational time or difficulty.

SUMMARY OF THE INVENTION

To address the above-discussed deficiencies of the prior art, the present invention provides, for use in an integral equation formulation of capacitance, a system for, and method of, generating a representation of charge distribution for a given capacitive structure (which may be an integrated circuit). In one embodiment, the system includes: (1) a charge variation function generator that creates a multidimensional charge variation function wherein the charge variation function is not directly dependent on a conductive geometry of the structure and (2) a conductive geometry generator, associated with the charge variation generator, that creates a representative conductive geometry wherein the representative conductive geometry is independent of charge variation in the structure. Both the charge variation function and the representative conductive geometry are employable in the integral equation formulation to reduce a complexity thereof.

The present invention therefore introduces the broad concept of rendering the charge distribution and the conductive geometry independent of one another, thereby significantly reducing the complexity of the subsequent integral equation formulation required to determine a structure's capacitance. The charge distribution may be represented by the charge variant function projected on the representative conductive geometry whereas the charge variant function represents a function used to modify the charge distribution function to reach a desired resolution.

In one embodiment of the present invention, the integral equation formulation is a Fast Distribution Method. Those skilled in the pertinent art will understand, however, that the broad scope of the present invention is not limited to a particular integral equation formulation.

In one embodiment of the present invention, the charge variation function is a three-dimensional function. Three-dimensional functions are particularly useful in describing integrated circuit structures. However, the present invention is not limited to a particular dimensionality.

In one embodiment of the present invention, the charge variation function is a smooth function of spatial location. Smooth functions can be accurately represented by low-order polynomials and are therefore advantageous.

In an illustrated embodiment of the present invention, the conductive geometry generator iteratively creates the conductive geometry. In the illustrated embodiment of the present invention, the charge variation function generator employs a generalized minimal residual-based krylov method to determine the multidimensional charge variation function.

In one embodiment of the present invention, the conductive geometry is represented in an octtree. The structure and function of octtrees will be set forth in the Detailed Description that follows. Those skilled in the pertinent art will understand, however, that octtrees are not required by the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
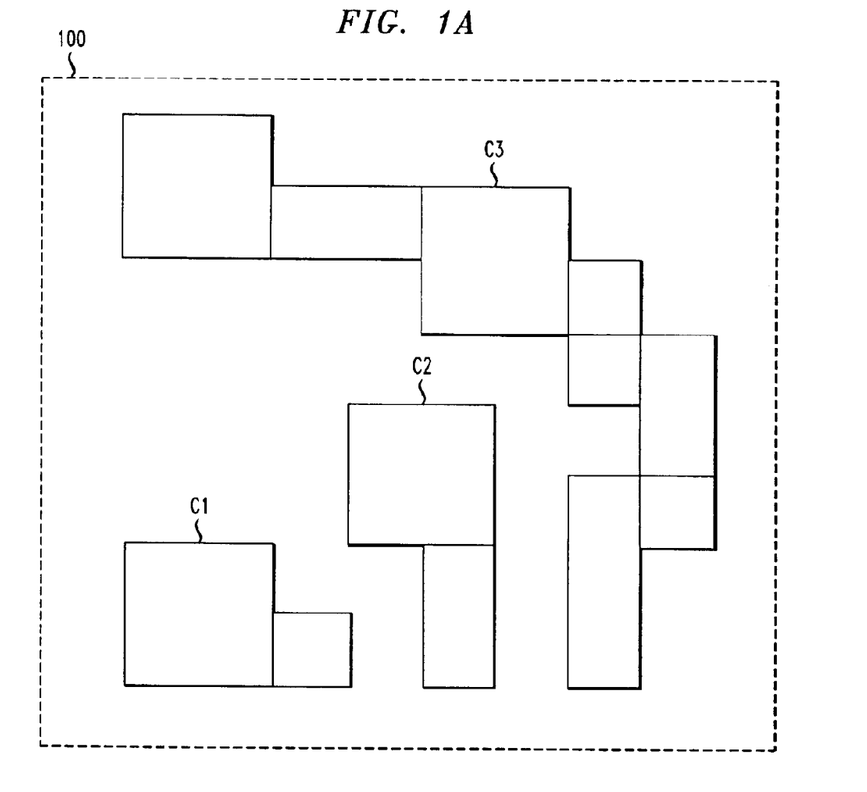
FIG. 1A illustrates a capacitive structure that forms one environment with which the present invention can operate on to reduce the complexity thereof.

Referring initially to FIG. 1A, illustrated is a capacitive structure that forms one environment with which the present invention can operate to reduce the complexity thereof. The capacitive structure 100 illustrates an example of three nets C1, C2, C3 in an integrated circuit (IC). A net is comprised of metallic pieces connected together to allow a current to pass from a first point in an IC to a second point in the IC. The net has an associated capacitance. The net may pass through and include portions of different IC structures that can affect the associated capacitance of the net. The IC structures may include traces, capacitors, switches, resistors and other elements that make up an IC.

The net C1 is a block representation of a first net within the capacitive structure 100. The net C2 is a block representation of a second net within the capacitive structure 100. The net C2 is associated with, but not coupled to, the net C1. The net C3 is a block representation of a third path within the capacitive structure 100 and is associated with, but not coupled to either one of, the net C1 and the net C2.

The capacitive value of the capacitive structure 100 depends upon the geometry of each of the nets C1, C2, C3, the capacitance for each of the nets C1, C2, C3 and the electromagnetic interplay between the nets C1, C2, C3. The capacitive value also depends upon the charge distribution for the capacitive structure 100.

As previously described, the difficulty with previous capacitance calculation approaches is that they require the geometry of the nets to be captured accurately, causing the minimum problem size for the capacitance calculation to exceed practical limits. The present invention addresses this substantial shortcoming by providing a method that does not require that the geometry of the nets be accurately captured.

Consider the capacitance of the net C1; it is affected by the net C3. However, the net C3 is located far enough away that the exact geometry of the net C3 is not critical. Therefore, were the net C3 to be replaced with a simpler geometric description, the number of unknowns could be reduced. In particular, the number of unknowns needed to determine the capacitance of the capacitive structure 100 would then be constrained by the charge distribution, rather than the geometry, of the nets.

In one embodiment of the present invention, the charge distribution is decoupled from the geometry of the nets. Decoupled means the charge variation is determined separately from the geometry. However, the charge distribution and the geometry are used in the actual capacitance calculation. Also, the surface charge distribution is represented as a charge variation function that is a smooth function of spatial location which is projected onto the geometry. This results in the number of unknowns being dictated solely by the charge distribution.

The geometry of the nets C1, C2, C3 is described hierarchically and captured to a level of detail needed to determine an accurate solution. For example, in FIG. 1A, since the net C2 is located close to the net C1, the net C1 and the net C2 are captured with relatively detailed geometric descriptions. However, since the net C3 is located far enough away from the net C1 then the net C3 may be captured with relatively coarse geometric descriptions.

Figure 1B:
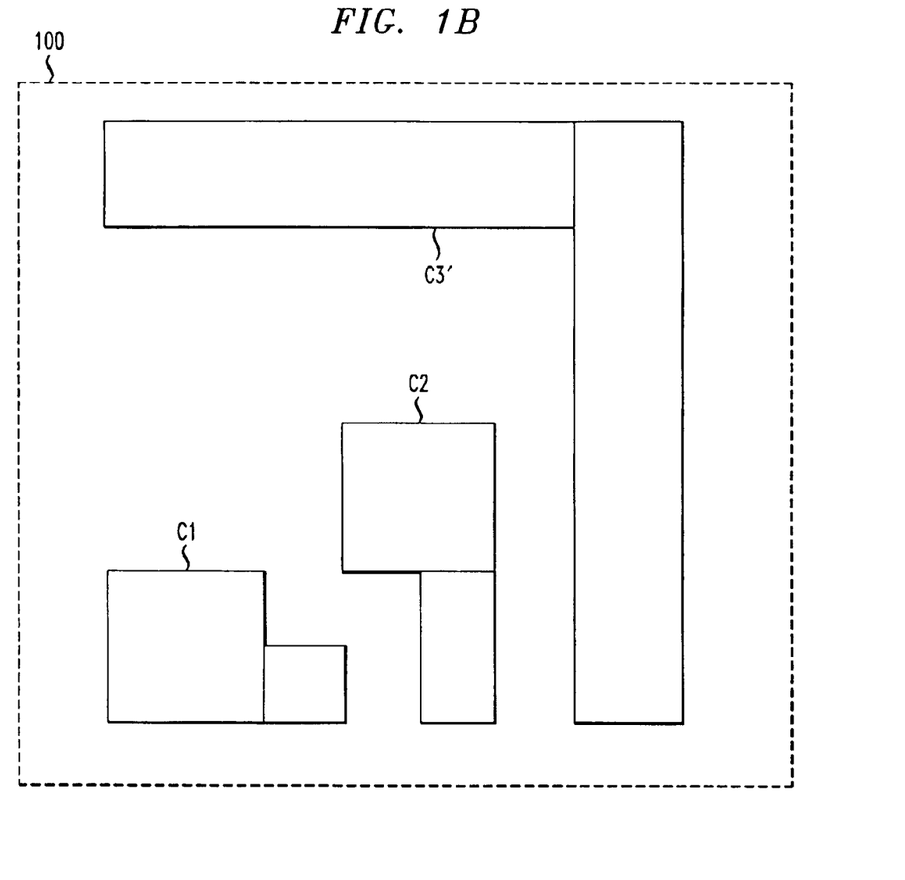
FIG. 1B illustrates an embodiment of the capacitive structure of FIG. 1A with the geometry of conductor C3 approximated to reduce complexity thereof according to the principles of the present invention.

FIG. 1B illustrates an embodiment of the capacitive structure of FIG. 1A with the geometry of conductor C3 approximated to reduce complexity thereof according to the principles of the present invention. In FIG. 1B, the net C3 is captured with a relatively coarse geometric description shown as C3'. The replacement geometric description C3' maintains the general shape of C3 with the same area and approximately the same distribution of area. Thus, C3' provides a simpler geometric description that can reduce the number of unknowns for capacitance calculations.

With the charge distribution decoupled from the geometry of the nets C1, C2, C3, the capacitance is calculated using an iterative linear solution. In one embodiment of the present invention, the present invention uses a Krylov method based on a Generalized Minimal Residual (GMRES) method to solve the capacitance of the nets C1, C2, C3. For more background material on this subject, see *GMRES: A Generalized Minimal Residual Algorithm for Solving Nonsymmetric Linear Systems*, by Y. Saad and M. H. Shultz, SIAM Journal on Scientific and Statistical Computing, 7(3) :856–69, 1986 (incorporated herein by reference).

Unlike standard GMRES, the present invention represents the net geometry as a set of the charge distribution functions rather than a set of discrete vectors. This method of representation is founded on the assumption that the charge variation function is a smooth function of spatial location. With the advantageous use of the charge variation functions, the present invention makes it possible to solve problems that are intractable with conventional methods.

Figure 2A:
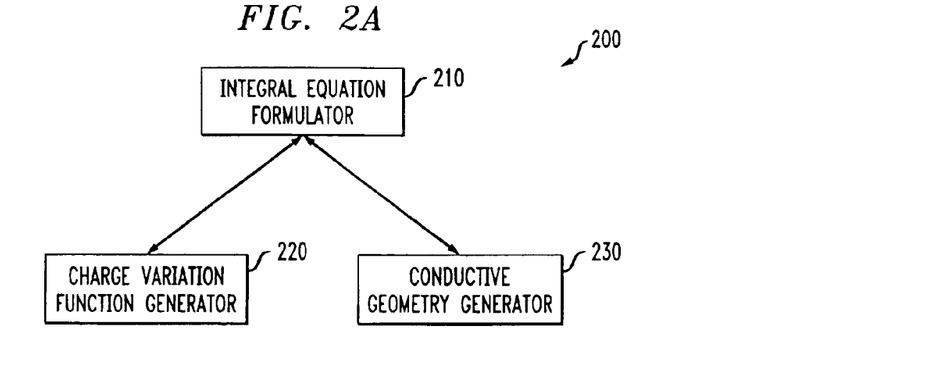
FIG. 2A illustrates a block diagram of a system for determining a capacitance of an integrated circuit constructed according to the principles of the present invention.

Turning now to FIG. 2A, illustrated is a block diagram of a system for determining a capacitance of an IC, generally designated 200, constructed according to the principles of the present invention. The system 200 comprises an integral equation formulator 210, a charge variation function generator 220, and a conductive geometry generator 230. The integral equation formulator 210 determines the total capacitance of all the nets C1, C2, C3 within the IC.

In determining the capacitance for the nets C1, C2, C3, the integral equation formulator 210 uses an iterative linear solution method. The iterative linear solution method is a recursive method that starts with a first guess of the geometry of a net and converges toward a charge distribution that is within acceptable limits when applied to the geometry. If the charge distribution is not within acceptable limits, the geometry is divided into smaller geographic elements called subdivisions. The iterative linear solution method is then performed on the subdivided structure. The resolution of the charge distribution and the subdivision of the geometry continues until the charge distribution for each of the subdivisions is within acceptable limits.

Once the integral equation formulator 210 has found the solutions for the charge distribution functions for each of the nets C1, C2, C3, the integral equation formulator 210 determines the capacitance for the nets C1, C2, C3.

Associated with the integral equation formulator 210 is the charge variation function generator 220. The charge variation function generator 220 creates charge variation functions that the integral equation formulator 210 uses to refine the representation of the charge distribution. For each iteration of linear solution method, the charge variation function generator 220 creates a charge variation function for a particular subdivision of the geometry.

Also associated with the integral equation formulator 210 is the conductive geometry generator 230. The conductive geometry generator 230 generates an advantageous description of the geometry of the IC by performing an adaptive subdivision of the nets C1, C2, C3. Over the course of the iterative linear solution method, the conductive geometry generator 230 may further subdivide the existing subdivisions of the geometry to assist the integral equation formulator 210 in reaching an acceptable solution.

In the illustrated embodiment, the integral equation formulator 210 uses a two-component representation of the charge distribution. The first component, $\chi_R$, is the characteristic function of the surfaces of the net and represents the geometry, without regard to the charge distribution. The second component is a charge distribution function that represents the charge distribution, without regard to the geometrical layout. Since the charge distribution and the geometry are wholly decoupled, the representation of the charge distribution projected on the geometry requires far fewer unknowns than previous methods.

In previous numerical analysis methods, the geometry of the entire set of net surfaces were incorporated into the calculations for any subdivision of the geometry. As a result, these methods required solving for a relatively large number of unknowns to account for all of the geometry of the nets C1, C2, C3. This included all the geometry that was far-removed from the subdivision being considered. In contrast, the present invention advantageously does not require the incorporation of all the far-removed subdivisions. This greatly reduces the number of unknowns required in solving for capacitance of the IC.

In one embodiment of the present invention, the characteristic geometry function for the set of net surfaces, $\chi_R$, is a predefined function. In an alternate embodiment of the present invention, $\chi_R$ is calculated from information related to the capacitive structure of the IC. $\chi_R$ is scalar-valued function that has a n-dimensional position as the input. To illustrate the form of $\chi_R$, suppose the geometry to be described is the unit square in the xy-plane. The form of $\chi_R$ for this geometry then would be:

$$\chi_R = s(x)s(y)\delta(z), \tag{1}$$

where $s(x)=1$ for $0 \leq x \leq 1$ and $s(x)$ is zero elsewhere, and $d(z)$ is the standard Dirac delta function. Those skilled in the art are familiar with the properties and use of Dirac delta functions.

The function f, which represents the charge distribution without regard to geometry, is evaluated over R, the set of surfaces of the nets C1, C2, C3. The surface integrals over R are reformulated as volume integrals via the relation:

$$\int_R f = \int_V f \chi_R \tag{2}$$

where V is the volume that the net comprises.

To solve the iterative linear solution, the integral equation formulator 210 uses an initial guess g, for the charge distribution, and a starting subdivision of the geometry of the net. The integral equation formulator 210 also creates the projection matrix $P_R$ from $\chi_R$.

$$P_R = \sum_k \langle \chi_R, l_k \rangle P_k \tag{3}$$

The bracketed expression above is the standard inner product for functions:

$$\langle f, g \rangle = \int_V f g \tag{4}$$

Also in this equation, $P_k$ is a primitive projection matrix where the (i,j) entry of $P_k = \int_V l_i l_j l_k$. Finally the $l_i$s represent the choice of orthogonal polynomials. In one embodiment of the present invention, Legendre polynomials form the system of orthogonal polynomials. One skilled in the pertinent art is familiar with and the use of Legendre polynomials. Also, $P^b_R$ will represent that part of $P_R$ that contains information of the geometry of subdivision b.

Using the initial guess g for the charge distribution and the starting subdivision of the geometry of the net, the integral equation formulator 210 determines charge distributions for a given potential on the nets C1, C2, C3. From the charge distributions, the integral equation formulator 210 determines the capacitance of the nets C1, C2, C3.

In the determination of the charge distributions, the iterative linear solution uses the following fundamental equation that relates the charge and the potential:

$$\psi(r) = \int_R G(r, r') \rho(r') dr' \tag{5}$$

where G (r, r') is the Green's function for the geometry of the IC and $\rho(r')$ is the charge density. Those skilled in the art are familiar with the properties and use of Green's functions.

In one embodiment of the present invention, the fundamental equation relating the charge and the potential is expressed as:

$$\psi = MP_R f \tag{6}$$

where the $\psi$ is a potential distribution and f represents the charge distribution without regard to the geometry. From this equation, the integral equation formulator 210 can determine the charge distribution function f.

In one embodiment of the present invention, the integral equation formulator 210 uses a Krylov method based on a variation of a Generalized Minimal Residual Method (GMRES) for the iterative linear solution. Background information concerning GMRES is discussed in *GMRES: A Generalized Minimal Residual Algorithm for Solving Nonsymmetric Linear Systems*, by Y. Saad and M. H. Shultz, SIAM Journal on Scientific and Statistical Computing, 7(3) :856–69, 1986 (incorporated herein by reference).

GMRES is used to solve for the charge distribution function f in the following equation:

$$\|MP_R f - \psi_0\|_R = 0 \tag{7}$$

or, equivalently:

$$P_R M P_R f = P_R \psi_0, \tag{8}$$

where M is an operator that converts a charge density to a potential distribution and $\psi_0$ is a potential which is 1 over an individual net and 0 elsewhere. Those skilled in the pertinent art are familiar with the application of GMRES. Nevertheless, below is a description of the process both to give a complete picture of the iterative linear solution process and to show the advantages of decoupling the charge variation from the geometry.

The integral equation formulator 210 starts iterative linear solution with an initial guess g for the charge distribution and an initial geometry. The integral equation formulator 210 also determines $X^b_R$, which represents the geometry of the box b in the subdivision, and $P^b_R$, which is the part of the projection matrix PR which covers the box b (see FIG. 3A for more information concerning geometry subdivisions and boxes). From this information, the integral equation formulator 210 computes a potential $\psi$ based upon the initial charge distribution guess g and the current subdivision.

The integral equation formulator 210 also determines the desired potential $\psi_0$:

$$P_R\psi_0 = P_s o \qquad (9)$$

where o is the constant function 1 over an individual net and $P_s$ is defined as $P_R$ over an individual net S. The integral equation formulator 210 then determines the difference between the desired potential $\psi_0$ and the potential $\psi$. This difference, $\psi_0 - \psi$, becomes first charge variation function $f_1$. Note that $f_1$ is not a representation of the charge distribution described by f. $f_1$ is a function used to modify the charge distribution function f to reach a desired resolution.

The integral equation formulator 210 determines the ratio $\gamma/\beta$, where $\gamma = \|f_1\|R$ and $\beta = \|\psi_0\|R$. If the ratio is sufficiently small, the iterative linear solution is complete.

If the ratio is unacceptably large, the integral equation formulator 210 normalizes $f_1$ and proceeds with the linear iterative solution. The integral equation formulator 210 then invokes the charge variation function generator 220 to create a charge variation function which refines the description of the charge distribution. At the beginning of the iterative process the charge variation function generator 220 creates a second charge variation function $f_2$. In general, the formula for the creation of the $j+1^{th}$ charge variation function from the $j^{th}$ charge variation function is:

$$f_{j+1} = MP_R^b f_j. \qquad (10)$$

Where M is an operator that converts a charge density to a potential distribution. The (i,j) entry of the matrix representation of M is:

$$M^{bc} = \int_b \int_c l_i^b l_j^c G(r,r') dr' dr \qquad (11)$$

Where $l^b_{i\ 1}$ is the $i^{th}$ moment in box b. Note that the operation of M involves all boxes, not just box b. G(r,r') is the Green's function for the set of net surfaces R. Those skilled in the art are familiar with the properties and use of Green's functions.

The charge variation function generator performs the operation M using a variant of the Fast Multipole Method (FMM) algorithm called the Fast Distributed Method (FDM). The FDM differs from the FMM in several areas. First, the FDM omits the FMM's initial step of computing multipole representations from point charges. FDM omits this step because the input is already in terms of a charge distribution. Second, the FDM omits FMM's direct point-to-point interactions. Instead, the FDM uses a source charge distribution in a cube. The potential distributions are calculated in all neighboring cubes, including the source cube itself.

Third, the FDM omits FMM's final step of interpolating point potentials from the local expansions. The FDM omits the last step, because the desired output is a potential distribution. Finally, FDM uses Legendre polynomial expansions for both charge distributions and local expansions. The FMM uses multipole expansions for representing charge distributions and local expansions for representing potential distributions.

The FMM algorithm, Legendre polynomial expansions and their use are well known to those skilled in the pertinent art. Background information concerning numerical analysis and capacitance calculations is discussed in *Introduction to Numerical Analysis*, by J. Soer and R. Bulirsh, Springer-Verlag 1979 and in *Preconditioned, Adaptive, Multipole-Accelerated Iterative Methods for Three-Dimensional First-Kind Integral Equations of Potential Theory*, by K. Nabors, et al., SIAM Journal on Scientific and Statistical Computing, 15(3):713–735, May 1994 (both incorporated herein by reference).

The use of the FDM results in a significant savings in time over both the analytical calculation using the explicit form of M and the FMM. The savings are due to the omission of several FMM steps and the omission of FMM's direct point-to-point interactions.

Once the charge variation function generator 220 has created the charge variation function $f_{j+1}$, the integral equation formulator 210 uses this new function to create the (i, j) entry of a Hessenberg matrix:

$$H_{ij} = \langle f_i, f_{j+1} \rangle_R \qquad (12)$$

for all $i \leq j$.

The integral equation formulator 210 uses the Hessenberg matrix to solve for the new coefficients of the charge variation functions to be used to further refine the charge distribution function f.

After the entries in the Hessenberg matrix are computed, the integral equation formulator 210 then orthogonalizes $f_{j+1}$ from the other $f_i$s. The charge variation function generator 220 then creates the (j+1,j) entry of the Hessenberg matrix by the expression:

$$H_{j+1,j} = \|f_{j+1}\|_R. \qquad (13)$$

This expression is the standard norm of functions defined by:

$$\|f\|_R = \sqrt{\langle f, f \rangle} = \sqrt{\int_R f^2} \qquad (14)$$

After the creation of this last entry of the Hessenberg matrix, the integral equation formulator 210 then normalizes $f_{j+1}$. The orthogonalization and the normalization of $f_{j+1}$ create orthonormal charge variation functions. As a result, the integral equation formulator 210 is able to obtain the correct charge distribution function f very quickly.

The integral equation formulator 210 then solves for x, the coefficient vector for the charge variations, using least-squares on the equation:

$$Hx = \gamma e_1 \qquad (15)$$

where H is the Hessenberg matrix generated by the integral equation formulator 210 as explained above $e_1$ is the $1^{st}$ unit vector with the form (1,0,0,0,0, . . . ) (with j number of zeros). The vector x is the coefficient vector for the charge distributions and $\gamma$ is the norm of the first charge variation function. $\gamma$ is defined as:

$$\gamma = \|f_1\|_R. \qquad (16)$$

Since the charge variation and the geometry are decoupled, the representation of the $f_i$ will not become very large as compared to the previous methods. Using the residual of the least squares, the integral equation formulator 210 computes the factor r as the 2-norm of the least squares residual.

The integral equation formulator 210 then generates a new guess for the charge distribution function f using the equation:

$$f = g + \sum_{i=1}^{j} x_i f_i \quad (17)$$

The integral equation formulator 210 then determines the ratio $r/\beta$. Where r is the 2-norm of the least squares residual r and $\beta$ is the norm of the desired potential (defined earlier as $\beta = \|\psi_0\| R$). If the ratio is within acceptable limits, the charge distribution has converged and the integral equation formulator 210 terminates the iterative linear solution.

If the ratio is not within acceptable limits, the integral equation formulator 210 uses the new guess for the charge distribution function f, calculated above, as the starting point for the next iteration of the iterative linear solution. However, before the integral equation formulator 210 performs the next iteration, the integral equation formulator 210 must determine if the current subdivision requires a more refined approximation.

The integral equation formulator 210 determines if the current subdivision b requires refinement by calculating a charge-geometry error e. In one embodiment of the present invention, the integral equation formulator calculates the charge-geometry error $e^b$ associated with box b in the subdivision using the following equation:

$$e^b = \sum_{i=k}^{N-1} f_i^b l_i \quad (18)$$

Where $l_i$ is the $i^{th}$ moment basis function. f represents the distribution of the charge without any reference to the geometry of the IC and $f_i^b$ is the component of f along the $i^{th}$ moment for the charge function contained in the subdivision b. The summation of $l_i$ between k and N−1 represent the high order polynomials. Finally, N is the number of moments used in the expansion of f.

The integral equation formulator 210 then determines if the charge-geometry error is within acceptable limits using a charge-geometry error criterion. The charge-geometry error criterion is defined as:

$$\|e^b\|_R < \frac{\varepsilon}{\|f\|_S} \quad (19)$$

Where S is the minimal subdivision containing the selected net. $\varepsilon$ is a small constant that determines the allowable tolerance of the criterion. Also, $\|e^b\|_R$ is the magnitude of the charge-geometry error in subdivision b. Note that the error threshold is relative to the charge distribution f only on the subdivision of the selected net.

If the charge-geometry error criterion is within acceptable limits, the integral equation formulator 210 has finished the resolution of the charge variation function. If the charge-geometry error criterion is not within acceptable limits, then the integral equation formulator 210 calls the conductive geometry generator 230 to refine the approximation of the geometry by subdividing the current subdivision b. See FIG. 3 for a discussion of the refining the approximation of the geometry of a net.

After the conductive geometry generator 230 has subdivided the geometry, the integral equation formulator 210 then starts the iterative linear solution again on the new subdivision. The integral equation formulator 210 uses the last calculated charge distribution function f as the starting point for the calculations on the new subdivision.

Once the integral equation formulator 210 has completed the iterative linear solution calculations for all the nets, the integral equation formulator 210 then calculates the capacitance of the IC. To determine the capacitance, the total charge on each net is computed from the charge distribution. The charge on the net whose surface is S is $\int_S f$. The present invention is not limited to a single method of determining capacitance. Other methods of determining capacitance from charges on nets are within the broad scope of this invention. Background information concerning the calculation of the capacitance is discussed in *Classical Electrodynamics*, by John Jackson, John Wiley & Sons (3d edition, 1998) (incorporated herein by reference).

Figure 2B:
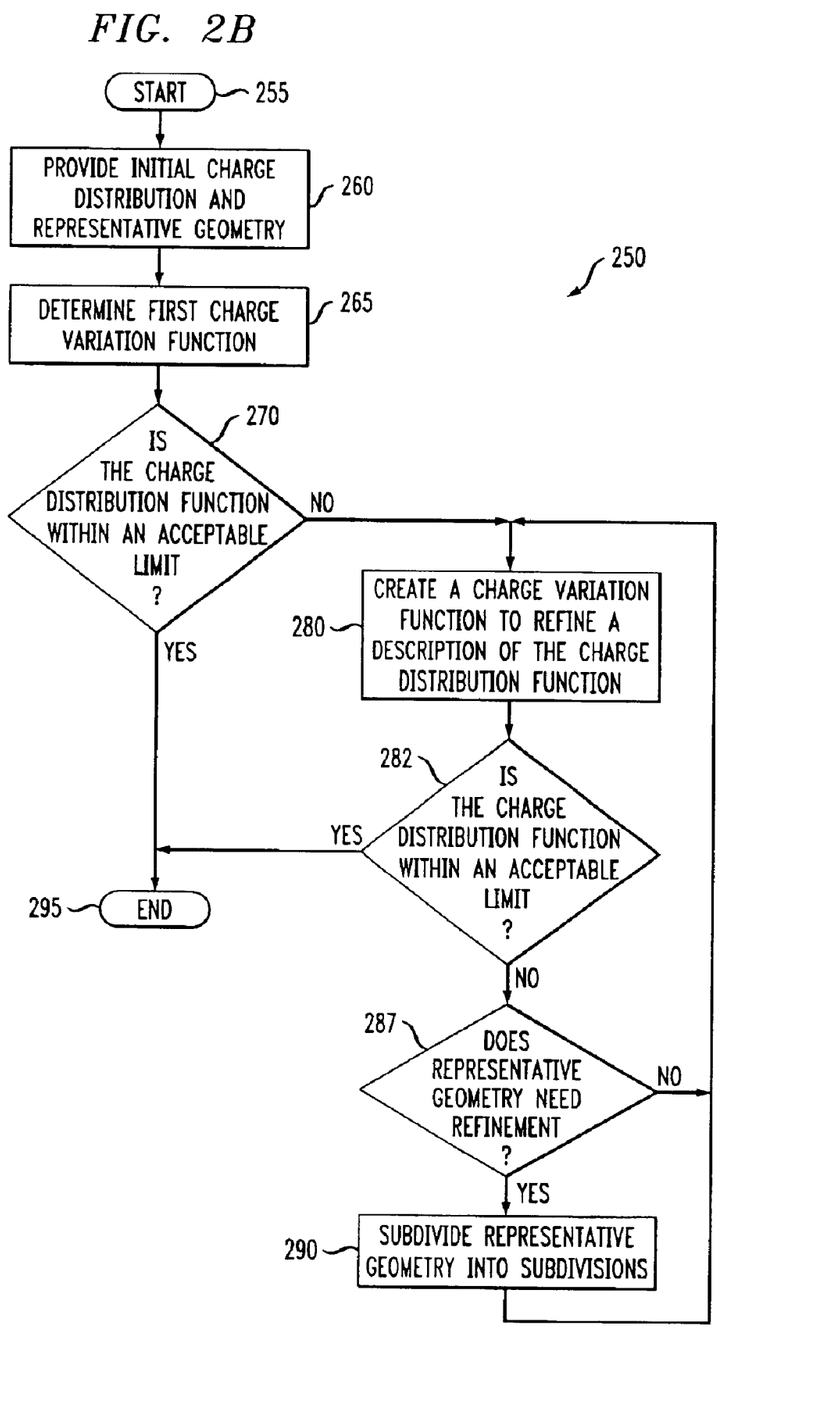
FIG. 2B illustrates a flow chart of a method of generating a representation of charge distribution for a given capacitive structure carried out according to the principles of the present invention.

Turning now to FIG. 2B with continued reference to FIG. 2A, illustrated is a flow diagram of an embodiment of a method of generating a representation of charge distribution for a given capacitive structure carried out according to the principles of the present invention. The method starts in a step 255 with an intent to generate a representation.

After starting, an initial charge distribution and a representative geometry are provided in a step 260. The initial charge distribution and the initial representative geometry may be guesses and are used to start an iterative linear solution. The initial guess for the charge distribution may be designated g and the initial guess for the representative geometry may be a subdivision of a geometry of a net associated with the capacitive structure.

After an initial charge distribution and representative geometry are provided, a first charge variation function is then determined in a step 265. The first charge variation function, $f_1$, may be the difference between $\psi_0$ and $\psi$. In one embodiment, the first charge variation function may be determined by solving for $\psi_0$ and $\psi$ using Equations 6 to 9.

After determining the first charge variation function, a determination is made if the charge distribution is within an acceptable limit in a first decisional step 270. In one embodiment, the acceptance of the charge distribution may be within an acceptable limit if the ratio $\gamma/\beta$ is sufficiently small. If the charge distribution, which is the initial guess g at this point, is within an acceptable limit, the method 250 ends in a step 295.

If the charge distribution is not within an acceptable limit, an other charge variation function is created to refine a description of the charge distribution in a step 280. In one embodiment, the first charge variation function $f_1$ may be normalized before proceeding with the linear iterative method. To create the charge variation functions, several steps may be involved. In general, equation 10 is used to create $j+1^{th}$ charge variation function from the $j^{th}$ charge variation function. Equations 12 and 13 are then used to create entries of a Hessenberg matrix that is used to solve for new coefficients of charge variation functions for further refining. Employing equation 15, the method 250 solves for the coefficient vector for the charge variations. Equation 17 may then be used to generate a new guess for the charge distribution function.

After refining the description of the charge distribution, a determination is made if the charge distribution is within an acceptable limit in a step 282. In one embodiment, the charge distribution is within an acceptable limit based on the ratio $r/\beta$. If the ratio is within acceptable limits, the charge distribution has converged and the method 250 continues to step 295 and ends.

If the charge distribution is not within acceptable limits, a determination is made if the representative geometry needs refinement in a third decisional step 287. In one embodiment, the method 250 may employ Equations 18 and 19 to determine if the representative geometry needs refinement. If the representative geometry does not need refinement, the method continues to step 280. If the representative geometry does need refinement, the representative geometry is subdivided into subdivisions in a step 290. See FIG. 3a and the corresponding discussion for more details regarding refining an approximation of the net. After subdividing the representative geometry, the method 250 continues to the step 280.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and/or the grouping of the steps are not limitations of the present invention.

Figure 3A:
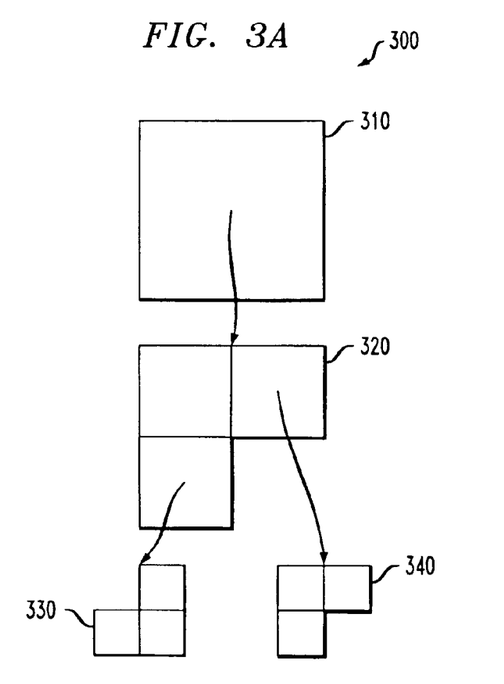
FIG. 3A illustrates a method of refining the approximation of the geometry of a capacitive structure using octtrees.

Turning now to FIG. 3A, illustrated is a method of refining the approximation of the geometry of a capacitive structure (or net) using octtrees. An octtree is a generalized way of subdividing the geometry into rectangular "boxes" that are congruent within every level of subdivision. Each box in a subdivision is called a "leaf."

The conductive geometry generator 230 starts with the initial geometry 310 of a net. When the integral equation formulator 210 determines that the initial geometry 310 needs to be refined, the conductive geometry generator 230 divides the initial geometry 310 into three leaves shown in the first subdivision 320. Usually the geometry generator 230 will divide a given portion of a geometry into four equal leaves. However, the conductive geometry generator 230 will discard any leaf that is not required for the approximation of the geometry. In this instance, the conductive geometry generator 230 discarded the lower right leaf in first subdivision 320.

On the next iteration of refining the approximation of the geometry, the conductive geometry generator 230 subdivides the lower left leaf, of the first subdivision 320, into three smaller leaves shown in the second subdivision 330. In this iteration, the conductive geometry generator 230 discarded the upper right leaf of the second subdivision 330.

On the final iteration of refining the approximation, the conductive geometry generator 230 subdivides the upper right leaf, of the first subdivision 320, into three smaller leaves shown in the third subdivision 340. In this iteration, the conductive geometry generator 230 discarded the lower right leaf of the third subdivision.

Figure 3B:
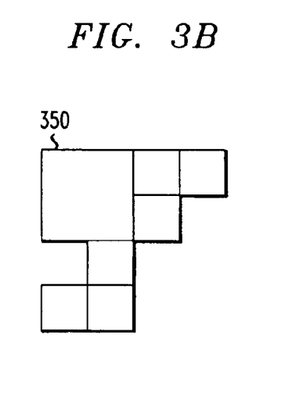
FIG. 3B illustrates the refined octtree representation of the geometry of a capacitive structure of FIG. 3A.

Now turning to FIG. 3B, illustrated is the refined octtree approximation of the geometry of the capacitive structure of FIG. 3A. The refined approximation 350 shows the results from the conductive geometry generator subdividing the initial conductive geometry 310. Note that the leaves are not of equal size. In particular, the leaf on the upper-left quadrant of 350 is four times larger than the other leaves illustrated. This is a result of the fact that although the n-dimensional boxes at a particular level are all the same size. However, all the leaves are not required to be the same size since the leaves are not generated from the same level of subdivision. The subdivision of one leaf does not mandate the subdivision on all other leaves that are the same size.

There are various advantageous reasons for using octtrees to approximate the geometry of a conductive structure. First, the description of any n-dimensional space is relatively simple. Second, octtrees provide a simple description of the geometry. Third, the boxes (leaves) that comprise an octtree fit together in a natural way regardless of how often they are subdivided. Fourth, it is a relatively simple task to ignore sections that are not important to the approximation of the geometry. Finally, any octtree can be refined to an arbitrary level of accuracy.

Figure 4:
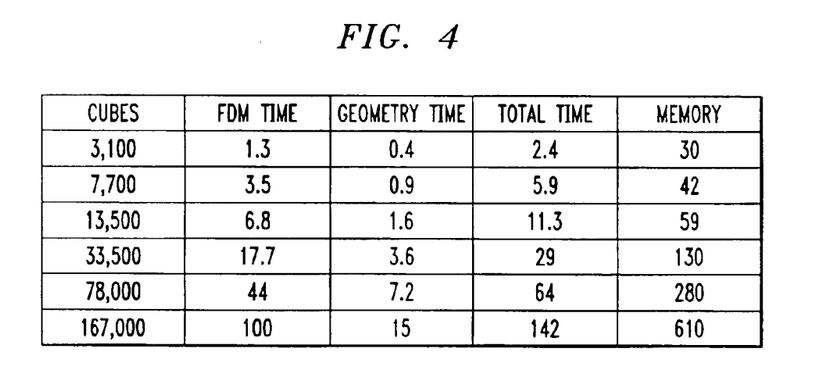
FIG. 4 illustrates a table of the time and memory required to determine the capacitance of a section of a digital chip employing an embodiment of an algorithm of the present invention.

Turning now to FIG. 4, illustrated is a table 400 of the time and memory required to determine the capacitance of a section of a digital chip employing an embodiment of an algorithm of the present invention. The algorithm was performed on an ULTRASparc II workstation (manufactured by Sun Microsystems) having a 400 Megahertz (MHZ) CPU and 1 Gigabyte of memory, which is a typical system that may be employed in performing the capacitance calculations of the present invention. The algorithm used octtrees with square subdivisions as the geometrical structure and employed a Krylov algorithm to solve for the charge variation. The tolerance of the system was set at about 5%.

The time and memory requirements illustrated are derived from calculations of an interconnect for the section of the digital chip. The section is about 0.5 mm on a side and is fabricated using 0.25 micron complementary metal oxide semiconductor ("CMOS") technology. The section contains 3,400 nets and geometry is described with 600,000 rectangles. Solving for the capacitance of a critical net required approximately two hours of CPU time and 610 Megabytes of memory. The calculation required a large amount of memory, in part, because this critical net of the digital chip is very close to many other nets.

The table 400 illustrates an exemplary time required by each part of the algorithm at various levels of refinement. The table 400 includes columns for (1) the number of cubes, (2) the time per iteration for the Fast Distribution Method, (3) the geometry manipulation time, including miscellaneous operations, (4) the total time per iteration and (5) the memory used. At the finest level there were approximately 5.8 million unknowns (with 35 moments for each cube). The algorithm required about 100 seconds to perform a FDM calculation.

The present invention thus allows companies to solve problems many times larger than possible using other conventional methods. The companies may therefore perform computational tests of proposed ICs without having to construct the proposed IC. The present invention provides the end user with the benefits of flexibility and speed. Flexibility may result from a choice of methods for solving for both the charge variation and the advantageous geometry. Speed is provided by the categorical division of the problem between solving for the charge variation and solving for the advantageous geometry.

Although the present invention has been described in detail, those skilled in the art should understand that they can make various changes, substitutions and alterations herein without departing from the spirit and scope of the invention in its broadest form.

What is claimed is:

1. For use in an integral equation formulation of capacitance, a system for generating a representation of charge distribution for a given capacitive structure, comprising:

a charge variation function generator that creates a multidimensional charge variation function that is not directly dependent on a conductive geometry of said structure; and a conductive geometry generator, associated with said charge variation generator, that creates a representative conductive geometry, wherein said charge variation function is projected on said representative conductive geometry to provide said representation of said charge distribution, said charge variation function and said representative conductive geometry employable in said integral equation formulation to reduce a complexity of said integral equation formulation.

2. The system as recited in claim 1 wherein said integral equation formulation is a Fast Distribution Method.

3. The system as recited in claim 1 wherein said charge variation function is a three-dimensional function.

4. The system as recited in claim 1 wherein said charge variation function is a smooth function of spatial location.

5. The system as recited in claim 1 wherein said conductive geometry generator iteratively creates said representative conductive geometry.

6. The system as recited in claim 1 wherein said charge variation function generator employs a generalized minimal residual-based Krylov method to determine said multidimensional charge variation function.

7. The system as recited in claim 1 wherein said representative conductive geometry is represented in an octtree.

8. For use in an integral equation formulation of capacitance, a method of generating a representation of charge distribution for a given capacitive structure, comprising:

creating a multidimensional charge variation function that is not directly dependent on a conductive geometry of said structure; and creating a representative conductive geometry, wherein said charge variation function is projected on said representative conductive geometry to provide said representation of said charge distribution, said charge variation function and said representative conductive geometry employable in said integral equation formulation to reduce a complexity of said integral equation formulation.

9. The method as recited in claim 8 wherein said integral equation formulation is a Fast Distribution Method.

10. The method as recited in claim 8 wherein said charge variation function is a three-dimensional function.

11. The method as recited in claim 8 wherein said charge variation function is a smooth function of spatial location.

12. The method as recited in claim 8 wherein said creating said representative conductive geometry comprises iteratively creating said representative conductive geometry.

13. The method as recited in claim 8 wherein said creating said multidimensional charge variation function comprises employing a generalized minimal residual-based Krylov method to determine said multidimensional charge variation function.

14. The method as recited in claim 8 wherein said representative conductive geometry is represented in an octtree.

15. A system for determining a capacitance of a given integrated circuit, comprising:

a charge variation function generator that creates a multidimensional charge variation function that is not directly dependent on a conductive geometry of said integrated circuit;

a conductive geometry generator that creates a representative conductive geometry, wherein said charge variation function is projected on said representative conductive geometry to provide a representation of a charge distribution for said given integrated circuit; and an integral equation formulator, associated with said charge variation generator and conductive geometry generator, that determines said capacitance of said integrated circuit based on said charge variation function and said representative conductive geometry.

16. The system as recited in claim 15 wherein said integral equation formulator employs a Fast Distribution Method.

17. The system as recited in claim 15 wherein said charge variation function is a three-dimensional function.

18. The system as recited in claim 15 wherein said charge variation function is a smooth function of spatial location.

19. The system as recited in claim 15 wherein said conductive geometry generator iteratively creates said representative conductive geometry.

20. The system as recited in claim 15 wherein said charge variation function generator employs a generalized minimal residual-based Krylov method to determine said multidimensional charge variation function.

21. The system as recited in claim 15 wherein said representative conductive geometry is represented in an octtree.

* * * * *